(12) United States Patent
Yen et al.

(10) Patent No.: US 9,780,162 B2
(45) Date of Patent: Oct. 3, 2017

(54) INTEGRATED INDUCTOR

(71) Applicant: Realtek Semiconductor Corporation, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/002,356

(22) Filed: Jan. 20, 2016

(65) Prior Publication Data

US 2016/0315136 A1    Oct. 27, 2016

(30) Foreign Application Priority Data

Apr. 24, 2015   (TW) .............................. 104113234 A (51) Int. Cl.
*H01L 49/02* (2006.01)
*H01L 23/58* (2006.01)
*H01L 23/532* (2006.01)
*H01L 23/522* (2006.01)

(52) U.S. Cl.
CPC .......... *H01L 28/10* (2013.01); *H01L 23/5227* (2013.01); *H01L 23/585* (2013.01)

(58) Field of Classification Search
None
See application file for complete search history.

(56) References Cited

U.S. PATENT DOCUMENTS

| 6,534,843 | B2 | 3/2003 | Acosta et al. |
| 7,847,666 | B2 | 12/2010 | Moinian et al. |
| 8,659,126 | B2 | 2/2014 | Lin et al. |
| 2009/0250262 | A1* | 10/2009 | Jin ...................... H01F 17/0006 174/384 |

FOREIGN PATENT DOCUMENTS

| TW | I349362 B | 9/2011 | |
| WO | WO 9850956 A1 * | 11/1998 | ......... H01F 17/0006 |

* cited by examiner

*Primary Examiner* — Whitney T Moore
(74) *Attorney, Agent, or Firm* — CKC & Partners Co., Ltd.

(57) ABSTRACT

An integrated inductor includes a patterned ground shield, an inner rail, and an inductor. The patterned ground shield is disposed in a first direction. The inner rail is coupled to the patterned ground shield. The inner rail is disposed inside the integrated inductor and in a second direction. The first direction is perpendicular to the second direction. The inductor is disposed above the patterned ground shield.

20 Claims, 8 Drawing Sheets

INTEGRATED INDUCTOR

RELATED APPLICATIONS

This application claims priority to Taiwan Application Serial Number 104113234, filed Apr. 24, 2015, which is herein incorporated by reference.

BACKGROUND

Field of Invention

The present disclosure relates to semiconductor structure. More particularly, the present disclosure relates to an integrated inductor.

Description of Related Art

With the progression of technology, an integrated inductor process has been developed toward 28 nm and 20 nm processes. In such miniature dimensions, there exist a significant number of negative effects due to the miniature size of the integrated inductor. For example, because the oxide layer of the integrated inductor is thinner, the capacitance thereof is higher; because redistribution layers (RDLs) adopted in the integrated inductor are thicker, the capacitance among the redistribution layers is higher; and so on. Those situations will affect inductor quality factors.

In view of the foregoing, problems and disadvantages are associated with existing products that require further improvement. However, those skilled in the art have yet to find a solution.

SUMMARY

The following presents a simplified summary of the disclosure in order to provide a basic understanding to the reader. This summary is not an extensive overview of the disclosure and it does not identify key/critical elements of the present disclosure or delineate the scope of the present disclosure.

One aspect of the present disclosure is directed to an integrated inductor which comprises a patterned ground shield, an inner rail, and an inductor. The patterned ground shield is disposed in a first direction. The inner rail is coupled to the patterned ground shield. The inner rail is disposed inside the integrated inductor and in a second direction. The first direction is perpendicular to the second direction. The inductor is disposed above the patterned ground shield.

Another aspect of the present disclosure is directed to an integrated inductor which comprises a patterned ground shield, a guard ring, an external rail, and an inductor. The patterned ground shield is disposed in a first direction. The guard ring is coupled to the patterned ground shield and disposed outside the integrated inductor. The external rail is coupled to the guard ring. The external rail is disposed outside the integrated inductor and in a second direction. The first direction is perpendicular to the second direction. The inductor is disposed above the patterned ground shield.

In view of the foregoing, embodiments of the present disclosure provide an integrated inductor to improve the problems of the decreased inductor quality factor.

These and other features, aspects, and advantages of the present disclosure, as well as the technical means and embodiments employed by the present disclosure, will become better understood with reference to the following description in connection with the accompanying drawings and appended claims.

BRIEF DESCRIPTION OF THE DRAWINGS

The disclosure can be more fully understood by reading the following detailed description of the embodiment, with reference made to the accompanying drawings as follows.

In accordance with common practice, the various described features/elements are not drawn to scale but instead are drawn to best illustrate specific features/elements relevant to the present disclosure. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

Figure 1:
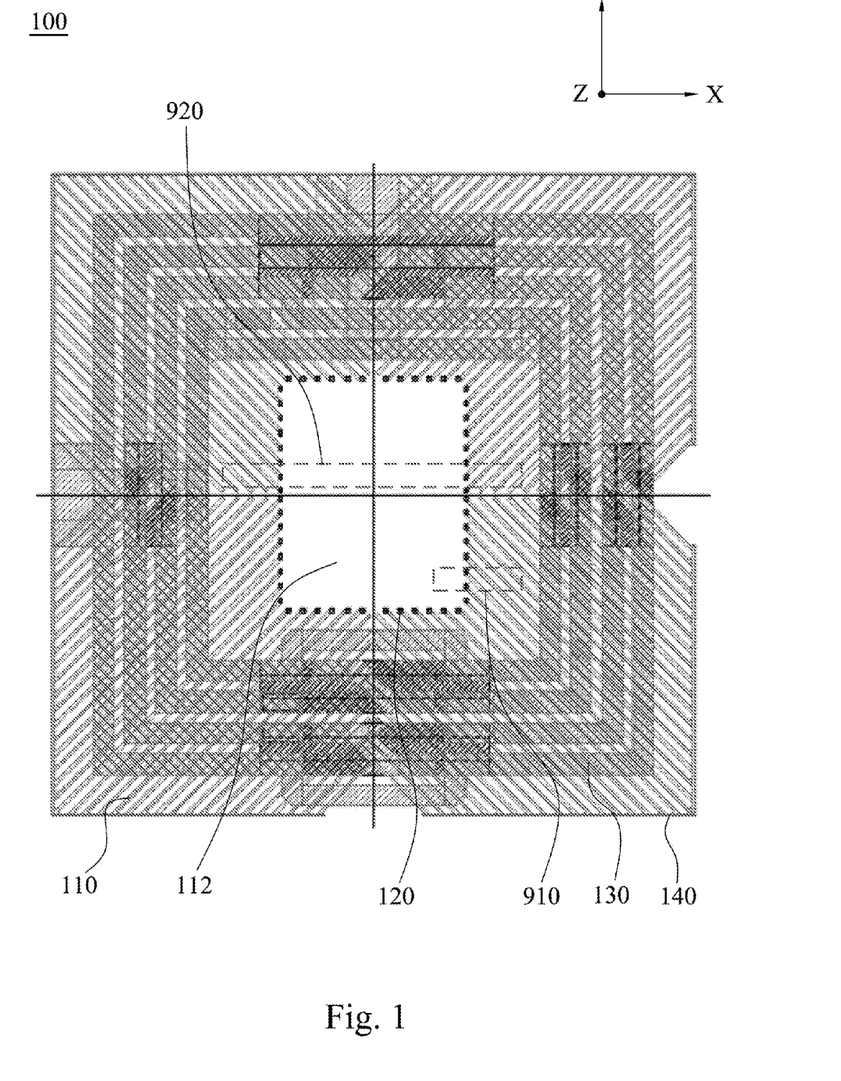
FIG. 1 is a schematic diagram of an integrated inductor according to embodiments of the present disclosure.

FIG. 1 is a schematic diagram of an integrated inductor according to embodiments of the present disclosure. As shown in the figure, the integrated inductor 100 comprises a bottom substrate (not shown), a patterned ground shield 110, an inner rail 120, an inductor 130, and a guard ring 140. With respect to structure, the patterned ground shield 110 is disposed on the bottom substrate and in a first direction. The inner rail 120 is coupled to the patterned ground shield 110. The inner rail 120 is disposed inside the integrated inductor 100 and in a second direction. The first direction is perpendicular to the second direction. For example, the first direction can be any direction on a XY surface, and the second direction can be Z direction, which is perpendicular to the XY surface. That is to say, the patterned ground shield 110 is disposed on the XY surface, and the inner rail 120 is disposed in Z direction. The direction of the patterned ground shield 110 and that of the inner rail 120 are perpendicular to each other. In addition, the inductor 130 is disposed above the patterned ground shield 110. In another embodiment, which is not shown in the figure, the inner rail 120 may be connected to each other by one or two metal layers, such as metal layer M1 and/or metal layer M2.

Figure 2:
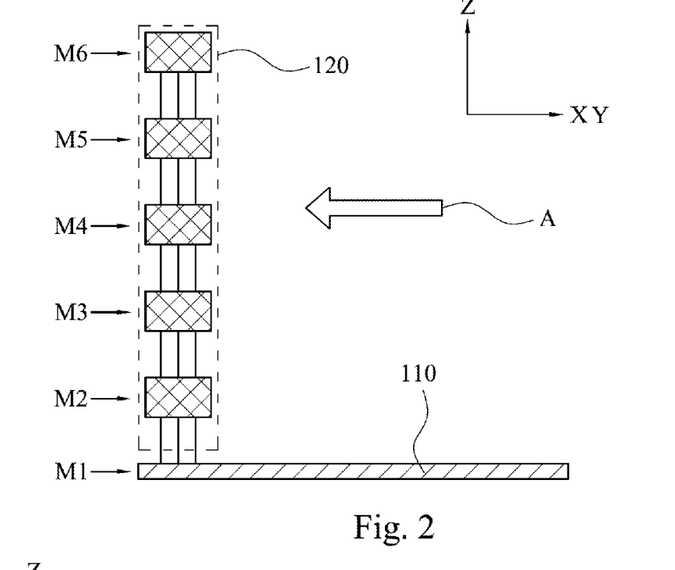
FIG. 2 is a portion of a cross-sectional diagram of an integrated inductor as shown in FIG. 1 according to embodiments of the present disclosure.

For facilitating the understanding of the structure of the integrated inductor 100 of embodiments of the present disclosure, reference is now made to FIG. 2, which is a portion of a cross-sectional diagram of an integrated inductor as shown in FIG. 1 according to embodiments of the present disclosure. It is noted that the portion of the cross-sectional diagram in FIG. 2 is obtained by profiling from label 910 in FIG. 1. As can be seen in the figure, the inner rail 120 extends upward from the patterned ground shield 110 in a perpendicular manner. Referring to FIG. 1, when the integrated inductor 100 operates, the magnetic field generated inside the inductor 130 will affect its quality factor. However, since the inner rail 120 is disposed perpendicular to the patterned ground shield 110, a rail structure is therefore formed inside the inductor 130. The rail structure can interfere with the magnetic field generated inside the inductor 130; and therefore, the problems of the decreased inductor quality factor of the inductor 130 can be improved efficiently, and the rail structure is capable of shielding electromagnetic field.

It is noted that the integrated inductor 100 of embodiments of the present disclosure comprises a first metal layer M1 to an eighth metal layer M8. The first metal layer M1 to the eighth metal layer M8 are disposed upward from the bottom layer of the integrated inductor 100 in a sequential order, and the sequence of the metal layers from the bottom layer of the integrated inductor 100 are the first metal layer M1, the second metal layer M2, . . . , a seventh metal layer M7, the eighth metal layer M8. For example, the patterned ground shield 110 is disposed in the first metal layer M1 or the second metal layer M2, and the inductor 130 is disposed in the seventh metal layer or the eighth metal layer M8.

Referring to FIG. 1, in another embodiment, the patterned ground shield 110 comprises an opening 112. The opening 112 is disposed inside the integrated inductor 100 and in the center of the patterned ground shield 110. As shown in figure, the inner rail 120 is disposed around the opening 112. It is noted that a person skilled in the art may dispose elements, for example, a metal insulator metal (MIM) capacitor, a metal oxide metal (MOM) capacitor, and/or a metal oxide semiconductor (MOS), inside the opening 112 depending on actual requirements. The above-mentioned elements may also be protected by the inner rail 120 of the integrated inductor 100 of embodiments of the present disclosure so as to avoid influence by the magnetic field and the electric field generated inside the inductor 130.

Figure 3:
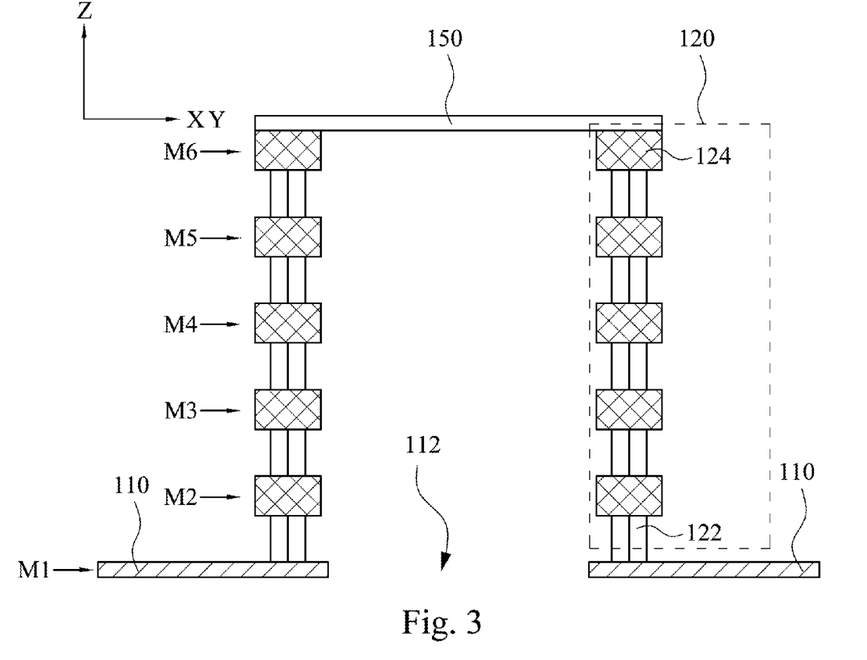
FIG. 3 is a portion of a cross-sectional diagram of an integrated inductor as shown in FIG. 1 according to embodiments of the present disclosure.

FIG. 3 is a portion of a cross-sectional diagram of an integrated inductor as shown in FIG. 1 according to embodiments of the present disclosure. The portion of the cross-sectional diagram in FIG. 3 is obtained by profiling from label 920 in FIG. 1. As shown in the figure, the patterned ground shield 110 and its opening 112 are disposed in the first metal layer M1 or the second metal layer M2, and the inductor 130 is disposed in the seventh metal layer M7 or the eighth metal layer M8. The inner rail 120 extends upward from the opening 112 in the first metal layer M1 to a bottom of the inductor 130 in the eighth metal layer M8 in a perpendicular manner, and the inner rail 120 is closed at the bottom of the inductor 130.

In another embodiment, the inner rail 120 comprises a bottom terminal 122 and a top terminal 124. The bottom terminal 122 of the inner rail 120 is coupled around the opening 112, and extends upward from the opening 112 in the first metal layer M1 to the top terminal 124 in a perpendicular manner. The top terminal 124 of the inner rail 120 can be disposed in the sixth metal layer M6, and the top terminal 124 is below the inductor 130 in the eighth metal layer M8. In addition, the integrated inductor 100 further comprises a patterned shield layer 150. The patterned shield layer 150 is coupled to the top terminal 124 of the inner rail 120 to close the inner rail 120. In another embodiment, the patterned ground shield 110 is disposed in the first metal layer M1, and the guard ring 140 is disposed in the first metal layer M1 or the sixth metal layer M6 depending on actual requirements.

Figure 4:
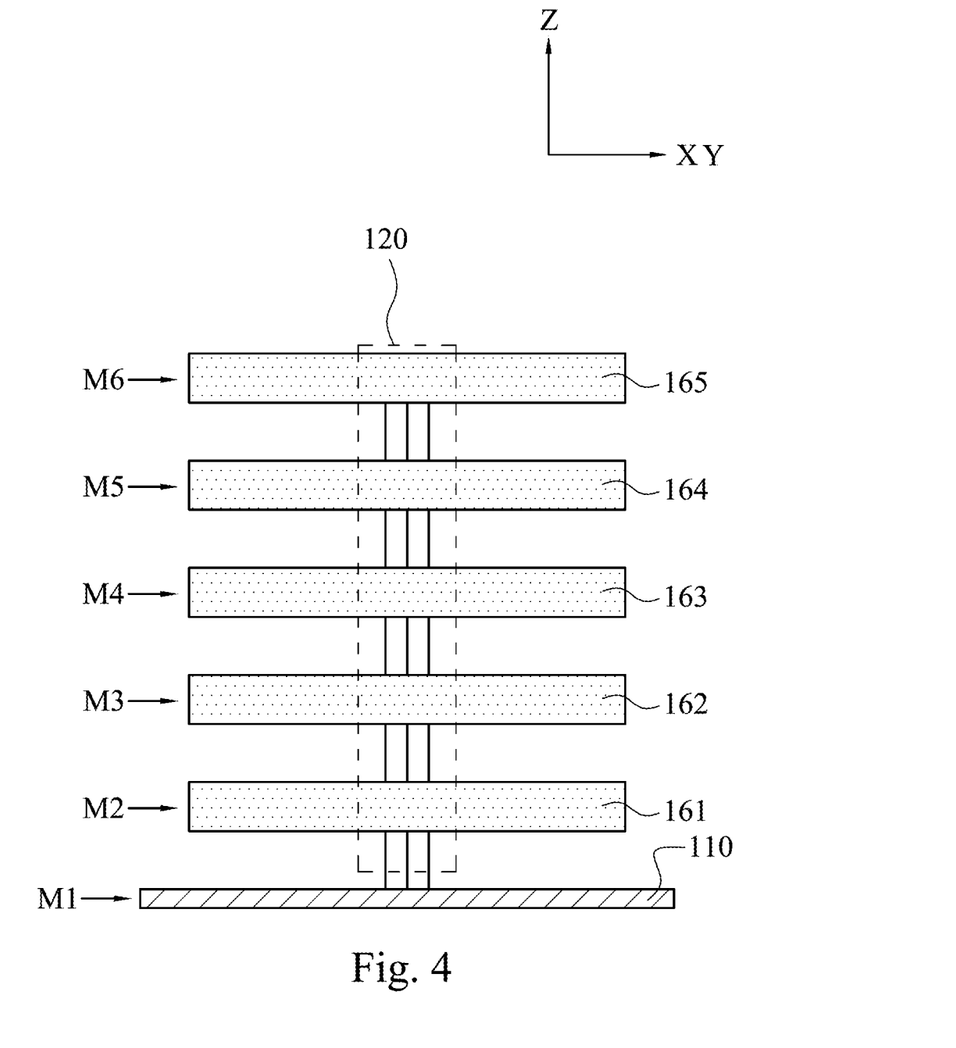
FIG. 4 is another visual angle diagram of a cross-sectional diagram of an integrated inductor as shown in FIG. 2 according to embodiments of the present disclosure.

FIG. 4 is another visual angle diagram of a cross-sectional diagram of an integrated inductor as shown in FIG. 2 according to embodiments of the present disclosure. Referring to FIG. 2, the structure in FIG. 4 is obtained by viewing the inner rail 120 from point A in FIG. 2. As shown in the figure, the integrated inductor 100 further comprises a plurality of strip portions 161~165, each of the strip portions 161~165 is respectively coupled to the inner rail 120 and disposed in the first direction. For example, the strip portions 161~165 can be disposed in any direction on the XY surface. In addition, the patterned ground shield 110 is disposed in any direction on the XY surface, and the inner rail 120 is disposed in Z direction. As shown in FIG. 4, the inner rail 120 and a plurality of strip portions 161~165 form a fishbone structure, and the fishbone structure can interfere with the magnetic field generated inside the inductor 130 such that the quality factor of the inductor 130 can be further improved and the fishbone structure becomes a shield for shielding from the electromagnetic field generated by the inductor 130.

Figure 5:
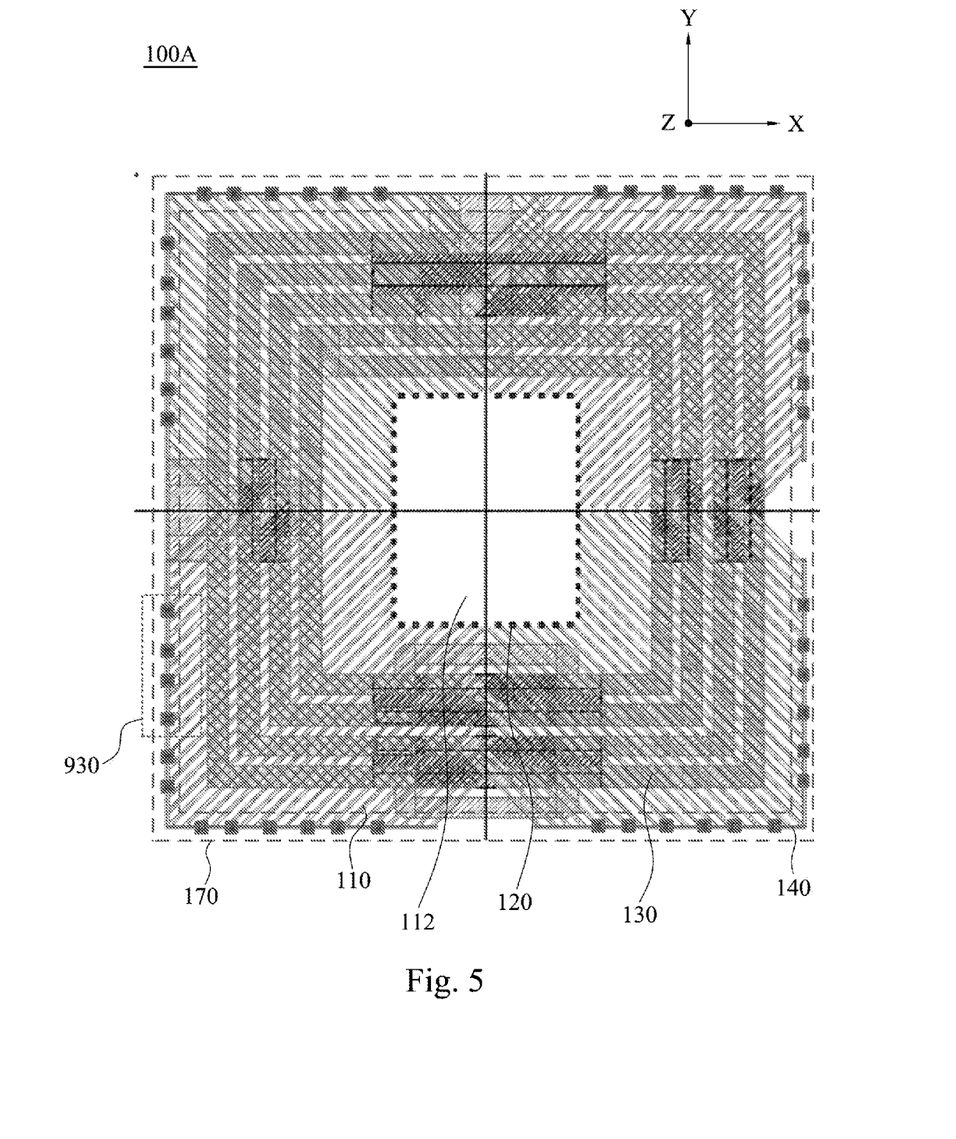
FIG. 5 is a schematic diagram of an integrated inductor according to embodiments of the present disclosure.

FIG. 5 is a schematic diagram of an integrated inductor according to embodiments of the present disclosure. Compared with integrated inductor 100 in FIG. 1, the integrated inductor 100A in FIG. 5 further comprises an external rail 170. The external rail 170 is coupled to the guard ring 140, and disposed at an external side of the integrated inductor 100A and in the second direction.

Figure 6:
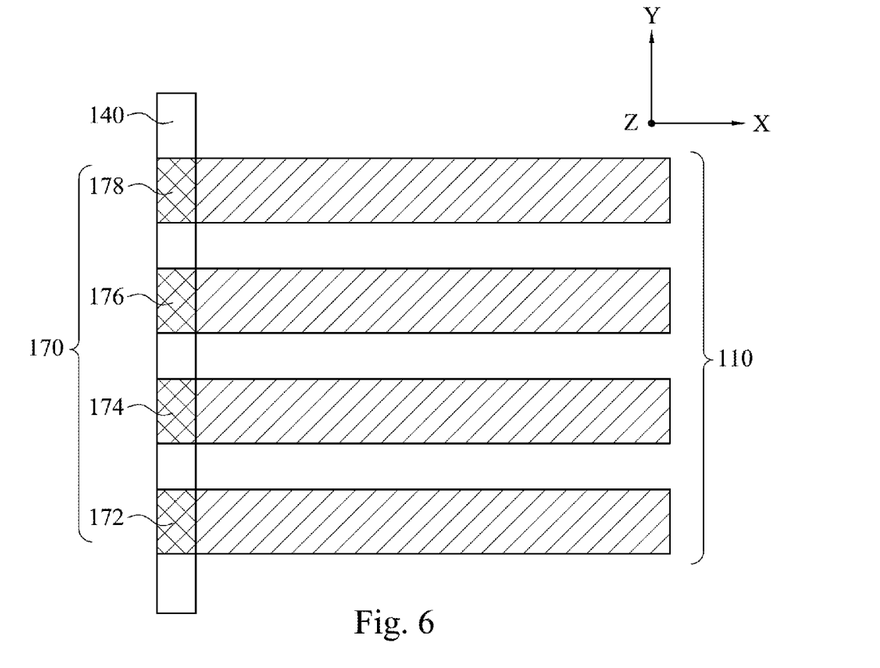
FIG. 6 is a partial enlarged diagram of an integrated inductor as shown in FIG. 5 according to embodiments of the present disclosure.

For facilitating the understanding of the structure of the integrated inductor 100A of embodiments of the present disclosure, reference is now made to FIG. 6, which is a partial enlarged diagram of an integrated inductor as shown in FIG. 5 according to embodiments of the present disclosure. It is noted that the partial enlarged diagram in FIG. 6 is a detail structure in label 930 of FIG. 5. As shown in FIG. 6, the guard ring 140 is coupled to the patterned ground shield 110, and each of the strip portions 172, 174, 176, 178 of the external rail 170 is coupled to a node where the guard ring 140 and the patterned ground shield 110 are connected to each other.

Figure 7:
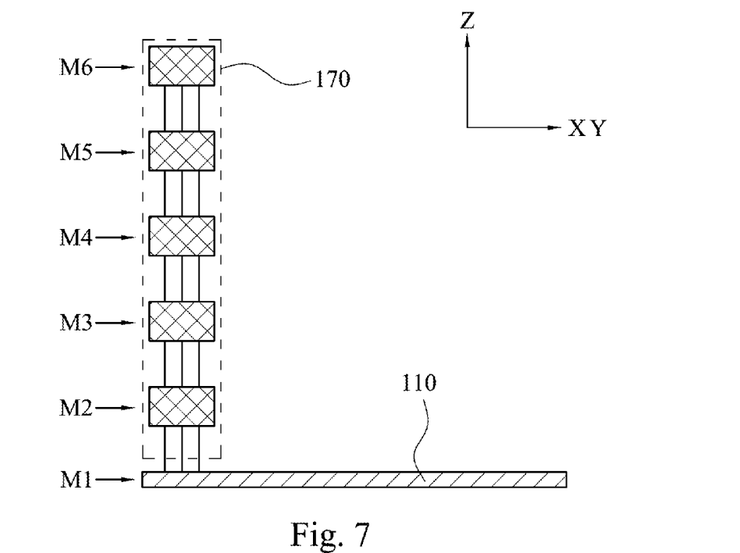
FIG. 7 is a cross-sectional diagram of an integrated inductor as shown in FIG. 6 according to embodiments of the present disclosure.

FIG. 7 is a cross-sectional diagram of an integrated inductor as shown in FIG. 6 according to embodiments of the present disclosure. As can be seen in the figure, the external rail 170 extends upward from the patterned ground shield 110 in the first metal layer M1 in a perpendicular manner. When the integrated inductor 100A operates, the magnetic field generated inside the inductor 130 will affect its quality factor. However, since the external rail 170 is disposed perpendicular to the patterned ground shield 110, a rail structure is therefore formed to efficiently interfere with the magnetic field generated inside the inductor 130; and therefore, the quality factor of the inductor 130 can be improved.

Figure 8:
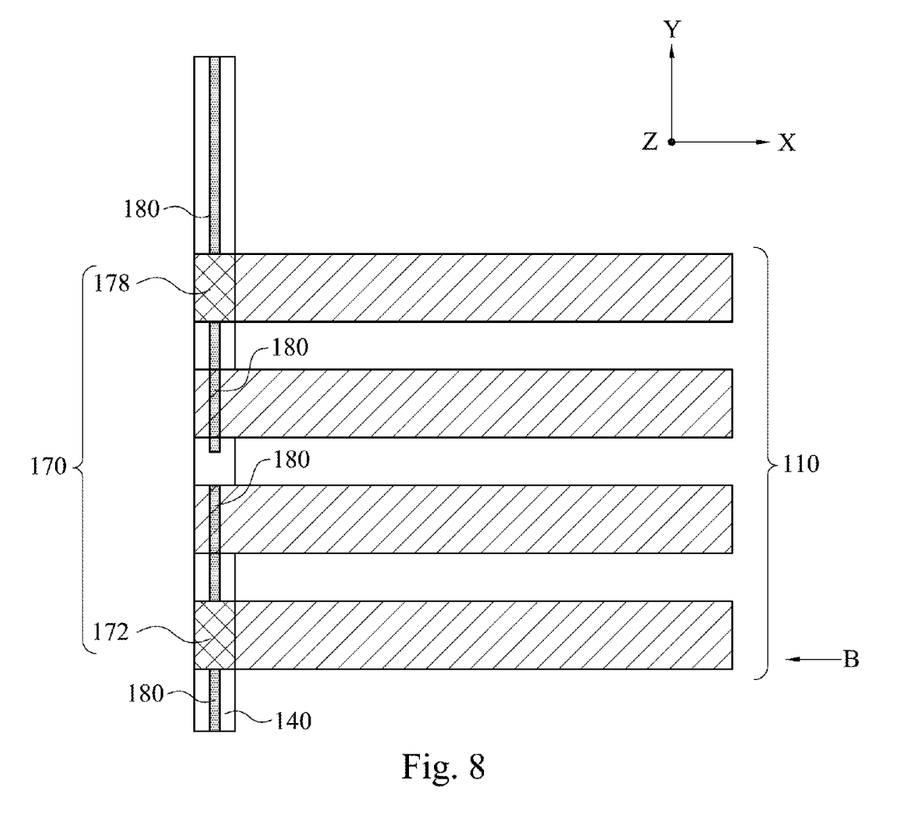
FIG. 8 is a partial enlarged diagram of an integrated inductor as shown in FIG. 5 according to embodiments of the present disclosure.

FIG. 8 is a partial enlarged diagram of an integrated inductor as shown in FIG. 5 according to embodiments of the present disclosure. It is noted that the partial enlarged diagram in FIG. 8 is a detail structure in label 930 of FIG. 5. In the embodiment, the integrated inductor 100A further comprises a plurality of strip portions 180, each of the strip portions 180 is respectively coupled to the external rail 170. Specifically, each of the strip portions 180 is respectively coupled to the strip portions 172, 178 of the external rail 170. In addition, the strip portions 180 are disposed in the first direction. For example, strip portions 180 are disposed in any direction on the XY surface, the patterned ground shield 110 is also disposed in any direction on the XY surface, and the external rail 170 is disposed in Z direction.

Figure 9:
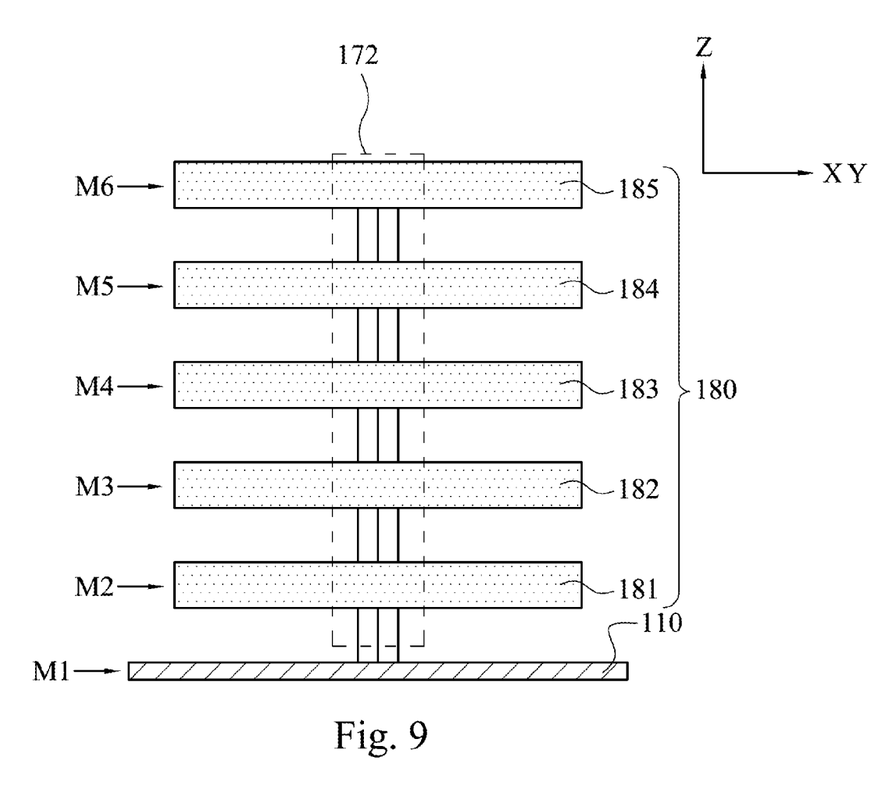
FIG. 9 is a cross-sectional diagram of an integrated inductor as shown in FIG. 8 according to embodiments of the present disclosure.

FIG. 9 is a cross-sectional diagram of an integrated inductor as shown in FIG. 8 according to embodiments of the present disclosure. Referring to FIG. 8, the structure in FIG. 9 is obtained by viewing the external rail 170 from point B in FIG. 8. As shown in FIG. 9, for facilitating the understanding of the strip portions 180 of the integrated inductor 100A in FIG. 8, the strip portions 180 are therefore drawn as the strip portions 181~185. Each of the strip portions 181~185 is respectively coupled to the external rail 170 and disposed in the first direction. For example, the strip portions 181~185 can be disposed in any direction on the XY surface. In addition, the patterned ground shield 110 is also disposed in any direction on the XY surface, and the external rail 170 is disposed in Z direction. As shown in FIG. 9, the external rail 170 and the strip portions 181~185 form a fishbone structure, and the fishbone structure can interfere with the magnetic field generated inside the inductor 130 such that the quality factor of the inductor 130 can be further improved.

Figure 10:
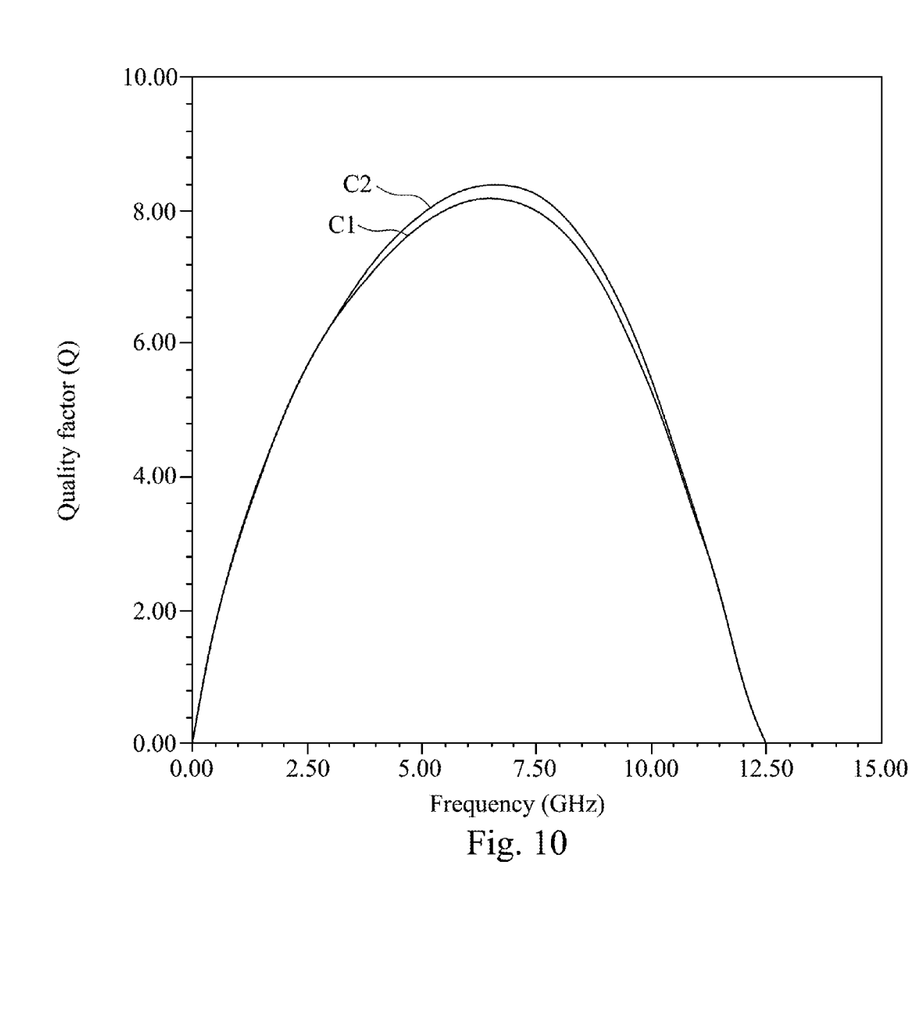
FIG. 10 is an experimental data diagram of an integrated inductor structure according to some embodiments of the present disclosure.

FIG. 10 is an experimental data diagram of an integrated inductor structure according to some embodiments of the present disclosure. This experimental data diagram is used for describing the quality factor of the inductor in the integrated inductor structure when the inductor operates in different frequencies. As shown in the figure, the curve C1 represents an experimental data if a rail perpendicular to a patterned ground shield patterned shield is not used in the integrated inductor structure. The curve C2 represents an experimental data if a rail perpendicular to a patterned ground shield patterned shield is used in the integrated inductor structure of embodiments of the present disclosure. As shown in FIG. 10, the quality factor as shown in the curve 2 is better than that in the curve 1. Therefore, it proves that the integrated inductor structure of the present disclosure indeed can improve the quality factor of the inductor in the integrated inductor structure and enhance the efficiency of the integrated inductor structure by 5%-10%. A person skilled in the art may change positions or forms of the integrated inductor structure for achieving the best efficiency.

In view of the above embodiments of the present disclosure, it is apparent that the application of the present disclosure has the advantages as follows. Embodiments of the present disclosure provide an integrated inductor structure. The inner rail and the external rail of the integrated inductor structure may interfere with the magnetic field generated inside the inductor; and therefore, the quality factor of the inductor can be improved. In addition, a person skilled in the art may dispose elements inside the opening depending on actual requirements. The above-mentioned elements may be protected by the inner rail of the integrated inductor so as to avoid influence by the magnetic field generated inside the inductor. Besides, the inner rail and a plurality of strip portions of the integrated inductor form a fishbone structure and/or the external rail and a plurality of strip portions form a fishbone structure to interfere with the magnetic field generated inside the inductor such that the quality factor of the inductor can be further improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An integrated inductor, comprising:
   a patterned ground shield disposed in a first direction;
   an inner rail coupled to the patterned ground shield, and disposed inside the integrated inductor and in a second direction, wherein the first direction is perpendicular to the second direction, wherein the inner rail extends upward from the patterned ground shield in a perpendicular manner; and
   an inductor disposed above the patterned ground shield;
   wherein the inner rail is not part of the inductor.

2. The integrated inductor of claim 1, wherein the patterned ground shield comprises:
   an opening disposed inside the integrated inductor and in a center of the patterned ground shield, wherein the inner rail is disposed around the opening.

3. The integrated inductor of claim 2, wherein the inner rail extends upward from the opening to a bottom of the inductor in a perpendicular manner, and the inner rail is closed at the bottom of the inductor.

4. The integrated inductor of claim 2, wherein the inner rail comprises:
   a bottom terminal coupled around the opening; and
   a top terminal;
   wherein the integrated inductor further comprises:
   a patterned shield layer coupled to the top terminal such that the inner rail is closed.

5. The integrated inductor of claim 1, further comprising:
   a plurality of strip portions, wherein each of the strip portions is coupled to the inner rail respectively and disposed in the first direction.

6. The integrated inductor of claim 1, further comprising:
   a guard ring coupled to the patterned ground shield and disposed outside the integrated inductor; and
   an external rail coupled to the guard ring, and disposed outside the integrated inductor and in the second direction.

7. The integrated inductor of claim 6, further comprising:
   a plurality of strip portions, wherein each of the strip portions is coupled to the external rail respectively, and disposed in the first direction.

8. The integrated inductor of claim 6, wherein the integrated inductor comprises a first metal layer to a sixth metal layer, wherein the first metal layer to the sixth metal layer are disposed upward from a bottom of the integrated inductor in a sequential order, wherein the patterned ground shield is disposed in the first metal layer, and the guard ring is disposed in the first metal layer or the sixth metal layer.

9. The integrated inductor of claim 1, wherein the inner rail is electrically coupled to the patterned ground shield.

10. The integrated inductor of claim 1, wherein the inner rail directly contacts the patterned ground shield.

11. An integrated inductor, comprising:
a patterned ground shield disposed in a first direction;
a guard ring coupled to the patterned ground shield and disposed outside the integrated inductor;
an external rail coupled to the guard ring, and disposed outside the integrated inductor and in a second direction, wherein the first direction is perpendicular to the second direction, wherein the external rail extends upward from the patterned ground shield in a perpendicular manner; and
an inductor disposed above the patterned ground shield;
wherein the external rail is not part of the inductor.

12. The integrated inductor of claim 11, further comprising:
a plurality of strip portions, wherein each of the strip portions is coupled to the external rail respectively and disposed in the first direction.

13. The integrated inductor of claim 11, wherein the integrated inductor comprises a first metal layer to a sixth metal layer, wherein the first metal layer to the sixth metal layer are disposed upward from a bottom of the integrated inductor in a sequential order, wherein the patterned ground shield is disposed in the first metal layer, and the guard ring is disposed in the first metal layer or the sixth metal layer.

14. The integrated inductor of claim 11, further comprising:
an inner rail coupled to the patterned ground shield, and disposed inside the integrated inductor and in the second direction.

15. The integrated inductor of claim 14, wherein the patterned ground shield comprises:
an opening disposed inside the integrated inductor and in a center of the patterned ground shield, wherein the inner rail is disposed around the opening.

16. The integrated inductor of claim 15, wherein the inner rail extends upward from the opening to a bottom of the inductor in a perpendicular manner, and the inner rail is closed at the bottom of the inductor.

17. The integrated inductor of claim 15, wherein the inner rail comprises:
a bottom terminal coupled around the opening; and
a top terminal;
wherein the integrated inductor further comprises:
a patterned shield layer coupled to the top terminal such that the inner rail is closed.

18. The integrated inductor of claim 14, further comprising:
a plurality of strip portions, wherein each of the strip portions is coupled to the inner rail respectively and disposed in the first direction.

19. The integrated inductor of claim 11, wherein the external rail is electrically coupled to the patterned ground shield.

20. The integrated inductor of claim 11, wherein the external rail directly contacts the patterned ground shield.

* * * * *